(12) United States Patent
Farooq et al.

(10) Patent No.: US 12,300,615 B2
(45) Date of Patent: May 13, 2025

(54) INFRARED DEBOND DAMAGE MITIGATION BY COPPER FILL PATTERN

(71) Applicant: INTERNATIONAL BUSINESS MACHINES CORPORATION, Armonk, NY (US)

(72) Inventors: Mukta Ghate Farooq, Hopewell Junction, NY (US); Qianwen Chen, Chappaqua, NY (US); Shahid Butt, Ossining, NY (US); Eric Perfecto, Poughkeepsie, NY (US); Michael P. Belyansky, Halfmoon, NY (US); Katsuyuki Sakuma, Fishkill, NY (US); John Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 18/056,393

(22) Filed: Nov. 17, 2022

(65) Prior Publication Data

US 2024/0170288 A1    May 23, 2024

(51) Int. Cl.
*H01L 23/535* (2006.01)
*B32B 43/00* (2006.01)
(Continued)

(52) U.S. Cl.
CPC ........ *H01L 23/535* (2013.01); *H01L 21/6835* (2013.01); *H01L 21/6836* (2013.01);
(Continued)

(58) Field of Classification Search
CPC . H01L 23/52; H01L 23/5225; H01L 23/5283; H01L 23/522; H01L 21/6836;
(Continued)

(56) References Cited

U.S. PATENT DOCUMENTS 8,267,143 B2    9/2012    George
9,111,983 B1    8/2015    Ginter
(Continued)

FOREIGN PATENT DOCUMENTS

WO    2014020390 A1    2/2014

OTHER PUBLICATIONS

Uhrmann, Thomas & Delmdahl, Ralph. (2013). Laser debonding enables advanced thin wafer processing. Solid State Technology. 56. 18-20. https://www.researchgate.net/publication/261831524_Laser_debonding_enables_advanced_thin_wafer_processing.

*Primary Examiner* — David A Zarneke
(74) *Attorney, Agent, or Firm* — Kimberly Zillig

(57) ABSTRACT

A stack structure that includes: a device wafer, a handler wafer, and a bonding structure disposed between the device wafer and the handler wafer, wherein one or both of the device wafer and the handler wafer have a release layer that is configured to be substantially or completely vaporized by infrared ablation when exposed to an infrared laser energy. The device wafer includes at least two consecutive layers adjacent the bonding structure that together include a plurality of fill portions that substantially or completely disable entry of the infrared laser energy into a plurality of layers of the device wafer below the two consecutive layers adjacent the bonding structure.

20 Claims, 5 Drawing Sheets

(51) Int. Cl.
*H01L 21/683* (2006.01)
*H01L 23/522* (2006.01)
*H01L 23/528* (2006.01)

(52) U.S. Cl.
CPC ...... *H01L 23/5225* (2013.01); *H01L 23/5283* (2013.01); *B32B 43/006* (2013.01); *H01L 2221/68318* (2013.01); *H01L 2221/68327* (2013.01); *H01L 2221/6835* (2013.01); *H01L 2221/68354* (2013.01); *H01L 2221/68368* (2013.01)

(58) Field of Classification Search
CPC ............ H01L 21/6835; H01L 21/6838; H01L 21/68318; H01L 21/68354; H01L 21/68327; H01L 21/6834; H01L 21/68368; H01L 21/68381; B32B 43/006
See application file for complete search history.

(56) References Cited

U.S. PATENT DOCUMENTS

| | | |
|---|---|---|
| 9,263,314 B2 | 2/2016 | Puligadda |
| 9,586,291 B2* | 3/2017 | Dang ................. G01R 31/2607 |
| 9,636,782 B2 | 5/2017 | Dang |
| 9,827,740 B2 | 11/2017 | Liu |
| 2016/0133497 A1* | 5/2016 | Andry ....................... B32B 7/12 428/333 |
| 2019/0096816 A1* | 3/2019 | Ho ...................... H01L 23/3675 |
| 2019/0131283 A1* | 5/2019 | Chen .................. H01L 23/5389 |
| 2020/0035625 A1* | 1/2020 | Wang .................. H01L 23/552 |
| 2023/0031430 A1* | 2/2023 | Liu ....................... H01L 21/565 |
| 2024/0021972 A1* | 1/2024 | Liao ................. H01L 23/49822 |
| 2024/0145457 A1* | 5/2024 | Che ......................... H01L 24/32 |

* cited by examiner

INFRARED DEBOND DAMAGE MITIGATION BY COPPER FILL PATTERN

BACKGROUND

The present disclosure relates to semiconductor wafer processing. More particularly, the present disclosure provides techniques to mitigate damage to devices in a device layer of a semiconductor stack structure, for example, during laser-assisted debonding processes.

In the field of semiconductor wafer processing, increasing demands for large-scale integration, high density silicon (Si) packages have resulted in making semiconductor dies thin. For some applications, Si wafers can be backside ground and polished down to a thickness of 50 micrometers (µm) or thinner. Although single crystal Si has a high mechanical strength, Si wafers and/or chips can become fragile as they are thinned. Defects can also be introduced by processing steps, which can further reduce the mechanical strength.

SUMMARY

According to some embodiments of the disclosure, there is provided a stack structure. The structure includes: a device wafer, a handler wafer, and a bonding structure disposed between the device wafer and the handler wafer, wherein one or both of the device wafer and the handler wafer have a release layer that is configured to be substantially or completely vaporized by infrared ablation when exposed to an infrared laser energy. The device wafer includes at least two consecutive layers adjacent the bonding structure that together include a plurality of fill portions that substantially or completely disable entry of the infrared laser energy into a plurality of layers of the device wafer below the two consecutive layers adjacent the bonding structure.

According to some embodiments of the disclosure, there is provided a method for handling a device wafer. The method includes bonding a handler wafer to a device wafer using a bonding structure that includes an adhesive layer and a release layer, wherein the device wafer includes a plurality of layers and at least two consecutive layers of the plurality of layers include a plurality of fill portions that substantially or completely disable entry of an infrared laser energy into a plurality of layers of the device wafer below the at least two consecutive layers that include the plurality of fill portions. The method also includes processing the device wafer while bonded to the handler wafer. The method further includes debonding the device wafer and the handler wafer by irradiating the release layer with the infrared laser energy through the handler wafer.

According to some embodiments of the disclosure, there is provided a method of making a semiconductor stack structure. The method includes forming a device wafer by forming a device layer including a plurality of devices, and forming at least two consecutive layers on a surface of the device layer that include a plurality of fill portions. The method further includes forming a handler wafer. The method also includes removably bonding the handler wafer to the device wafer using a bonding structure including an adhesive layer and a release layer, wherein the adhesive layer is applied to one of the at least two consecutive layers that include the plurality of fill portions. The method further includes exposing an infrared laser energy to the semiconductor stack structure through the handler wafer to cause debonding and release of the device wafer from the handler wafer as a direct result of a substantial or a complete vaporization of at least a portion of the bonding structure. The plurality of fill portions are configured to substantially or completely disable entry of the infrared laser energy into the device wafer below the two consecutive layers that include the plurality of fill portions.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
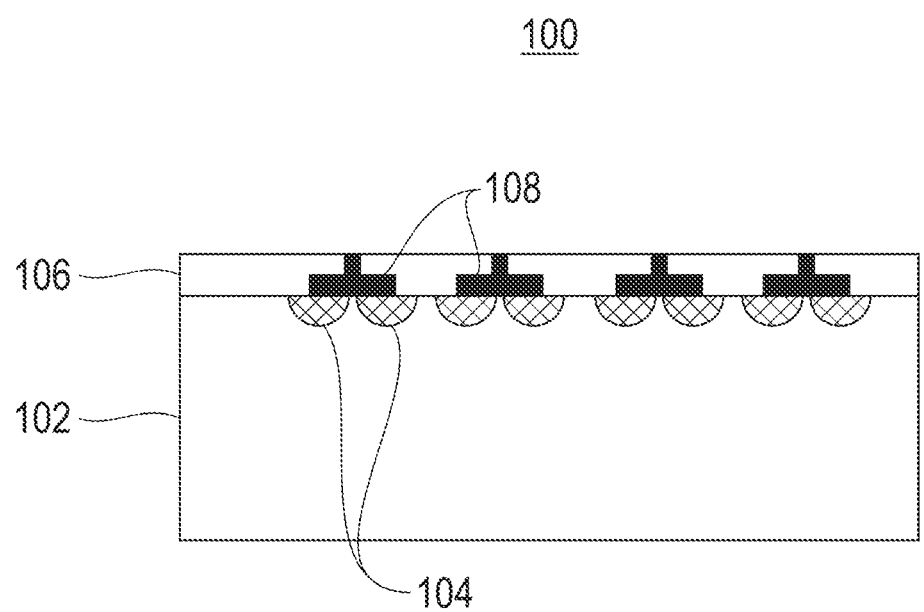
FIG. 1 is a cross-sectional view of a semiconductor stack structure at an early fabrication operation in successive fabrication operations of a process of forming the semiconductor stack structure in order to mitigate damage of the device wafer during a debonding process, in accordance with embodiments of the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to semiconductor wafer processing. More particularly, the present disclosure provides techniques in order to mitigate damage to devices in a device layer of a semiconductor stack structure during typical laser-assisted debonding processes. While the present disclosure is not necessarily limited to such applications, various aspects of the disclosure can be appreciated through a discussion of various examples using this context.

In order to facilitate processing of a device wafer, a handler wafer (or carrier wafer) can be attached to the device wafer to enhance mechanical integrity of the device wafer during processing. When processing of the device wafer is complete, the handler wafer is typically released from the device wafer. The most common approach to handling a device wafer is to laminate the handler wafer with the device wafer using specially developed adhesives. Depending on factors, such as processing steps, product requirements, and type of adhesive used, various techniques have been used or proposed to debond or separate a thinned device wafer from a handler wafer, including thermal release, chemical dissolving, mechanical release, and laser ablation techniques, for example.

Infrared (IR) lasers can be used to debond a device wafer from a handler wafer. During the debonding process, laser energy from IR lasers can cause damage to portions of the device wafer, such as lower back-end-of-line (BEOL) layers. The lower BEOL layers can include dielectrics or devices that are desired to be protected from any such damage.

Embodiments of the present disclosure relate to processing of a device wafer in order to mitigate damage of the device wafer during the debonding process. The device wafer can include a high BEOL structure with consecutive layers having fill portions that overlap and form a fill overlap pattern or layer that can disable entry of IR laser energy into lower BEOL layers. The material used for the fill portions can be copper (Cu) having a diameter of about 0.1 micrometer to a few micrometers, for example. The fill portions can be created and placed in order to provide full protection, or coverage, across two or more consecutive high BEOL layers from a first side to a second side of the device wafer. As a result, when an IR laser is used in the debonding process, IR laser energy is disabled from entry and does not pass through the fill overlap portion in the BEOL, and does not cause damage to devices within the device wafer.

Embodiments of the present disclosure include a process of forming a stack structure including fill portions in a pattern to provide coverage across two or more consecutive high BEOL layers. In the process, a device wafer, including devices, and a BEOL, up to an intermediate level, e.g., two (2) to three (3) layers before termination, are laid. A fill overlap pattern is designed and laid in at least the last two consecutive layers of the BEOL, in order to disable entry of IR laser energy into other layers of the BEOL and other structure below the BEOL in the device wafer. A next operation is to proceed with termination. Termination is deposition of under bump metallurgy (UBM), which can include some or all of titanium (Ti), Cu, nickel (Ni) and gold (Au). Adhesive bond structure can be created for a silicon (Si) carrier, which can include a release layer and an adhesive layer, in order to attach the Si carrier to the stack structure. The Si carrier can alternatively be a glass carrier. A wafer thinning process can be undertaken, e.g., through-silicon via (TSV) reveal, capture, etc. A debonding step can be performed using mid-wavelength IR laser energy, if the carrier is a Si wafer. After debonding, a cleaning operation can be needed to remove residual surface layers subsequently, a clean surface of the device wafer can be exposed and ready for a next step in semiconductor device fabrication.

One feature and advantage of the disclosed structures and processes is that a protective layer can be fabricated in consecutive layers on a device that can disable entry of the IR laser energy and prevent damage to BEOL dielectrics and devices during a debonding process.

For the sake of brevity, conventional techniques related to semiconductor device and IC fabrication may or may not be described in detail herein. Moreover, the various tasks and process steps or operations described herein can be incorporated into a more comprehensive procedure or process having additional operations or functionality not described in detail herein.

Turning to the figures, FIG. 1 is a cross-sectional view of a stack structure 100 at an early semiconductor fabrication operation in successive fabrication operations of a process of forming the stack structure 100 of a device wafer combined with a handler wafer in order to mitigate damage of the device wafer during a debonding process, in accordance with embodiments of the disclosure. FIG. 1 includes a device layer 102 that includes a plurality of devices 104, which can be active and/or passive. The plurality of devices 104 can be provided in the design of an ultimate integrated circuit (IC) chip to allow the IC chip to perform functions as desired. As used herein, the term "device layer" is used to describe a single or multilayer structure including a number of active or passive semiconductor components, the structure capable of performing at least part of the functional operations (i.e., semiconductor system performance) of a semiconductor structure. Device layers are typically fabricated separately on silicon on insulator (SOI) substrates or bulk Si substrates. Additionally, each device layer may include at least one interconnect and one or more of active Si, Gallium nitride (GaN) and III-V field-effect transistors (FETs). Example device layers can include complementary metal-oxide semiconductor (CMOS) integrated circuits having a pair of transistors, one using electrons and the other electron holes.

FIG. 1 also includes a front-end-of-line (FEOL) 106 layered atop the device layer 102 using any suitable FEOL processing technique. The FEOL processing can result in the FEOL 106 with components 108 (e.g., transistors, capacitors, resistors, etc.) that are patterned into the structure 100 as shown.

Figure 2:
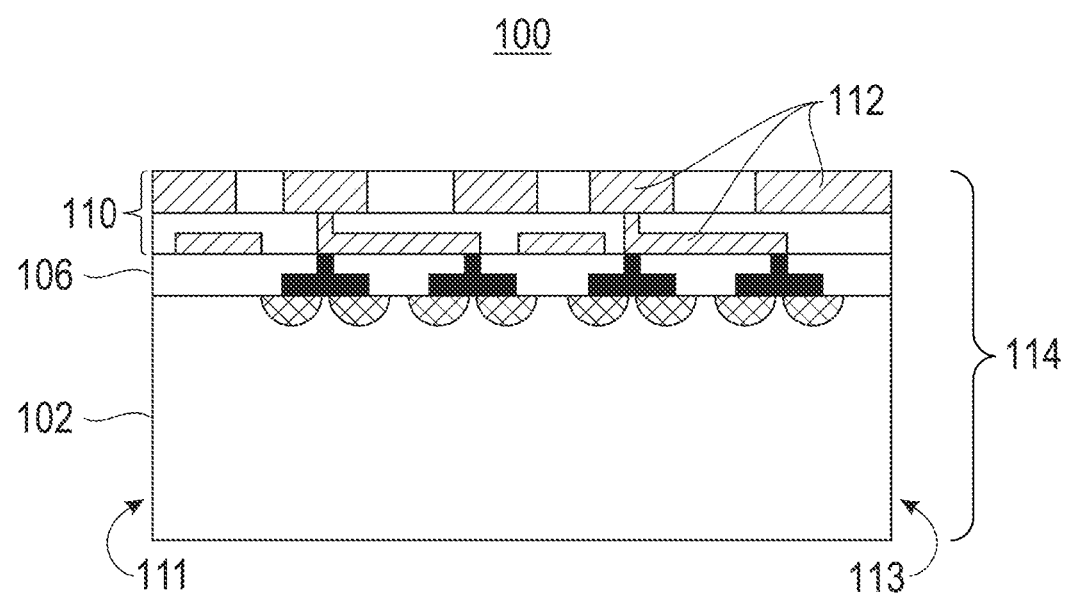
FIG. 2 is a cross-sectional view illustrating a process operation following that of FIG. 1, in accordance with embodiments of the disclosure.

FIG. 2 is a cross-sectional view illustrating a process operation following that of FIG. 1, in accordance with embodiments of the disclosure. After FEOL 106 processing, layers of BEOL 110 can be fabricated where the components 108 (e.g., transistors, capacitors, resistors, etc.) and devices 104 can be interconnected with wiring in a device wafer 114. BEOL 110 can generally begin when a first layer of metal is deposited. Multiple BEOL 110 layers can include contacts, insulating layers (dielectrics), metal levels, and bonding sites for chip-to-package connections (not shown).

The BEOL 110 structure is shown with two (2) consecutive layers having a plurality of fill portions 112 that form a fill overlap pattern that disables or otherwise significantly mitigates the entry of IR laser energy, during debonding, into lower layers of the stack structure 100 (or device wafer 114). The fill portions 112 can have any width, and all together provide protection (a complete fill overlap layer) across the device wafer 114 from a first side 111 to a second side 113. The fill portions 112 can form a Cu shield, for example, to prevent a laser from penetrating the Cu shield and entering the BEOL 110 and the FEOL 106. The use of the fill portions 112 provides a "crack stop" structure in x-y planes to form the fill overlap pattern.

The fill overlap pattern, made up of the fill portions 112, can include a fill material such as Cu, and the shield can be a Cu shield. Another example of a material that can be used in the fill portions 112 is aluminum (Al). Other suitable materials for the fill material are contemplated by the disclosure. The fill material can have standard fill dimensions. The fill dimensions can be on the order of a few nanometers, typically being in the hundreds of nanometers.

Figure 3:
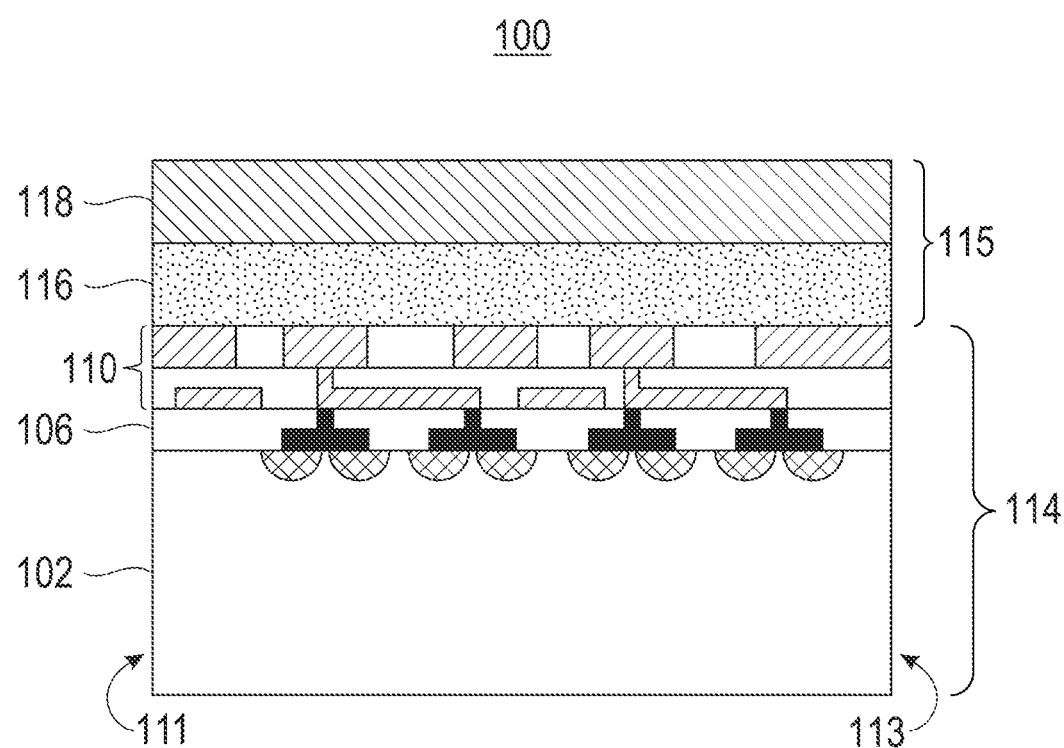
FIG. 3 is a cross-sectional view illustrating a process operation following that of FIG. 2, in accordance with embodiments of the disclosure.

FIG. 3 is a cross-sectional view illustrating a process operation following that of FIG. 2, in accordance with embodiments of the disclosure. The stack structure 100 shown includes a bonding structure 115 created on the device wafer 114 for temporarily, or removably, bonding the device wafer 114 to a handler wafer (shown in FIG. 4 as 120, and discussed below). The bonding structure 115 includes an adhesive layer 116, and a release layer 118.

The adhesive layer 116 can be formed of any suitable polymeric adhesive material, high-temperature thermoplastic polyimides, benzocyclobutene (BCB), acrylics, epoxies, or other bonding adhesive materials that are suitable for the given application. In one embodiment, the adhesive layer 116 can be formed of any suitable polymer adhesive material that may be capable of sufficiently absorbing the mid-wavelength IR laser energy output from an IR laser or source. The adhesive layer 116 can be formed by spin coating, and thermally baking the adhesive material to form the adhesive layer 116.

The release layer 118 can be formed by depositing a layer of metallic material (e.g., aluminum (Al)) using, for example, chemical vapor deposition (CVD), physical vapor deposition (PVD), or atomic layer deposition (ALD). Other suitable materials and deposition techniques are also contemplated for the release layer 118.

Figure 4:
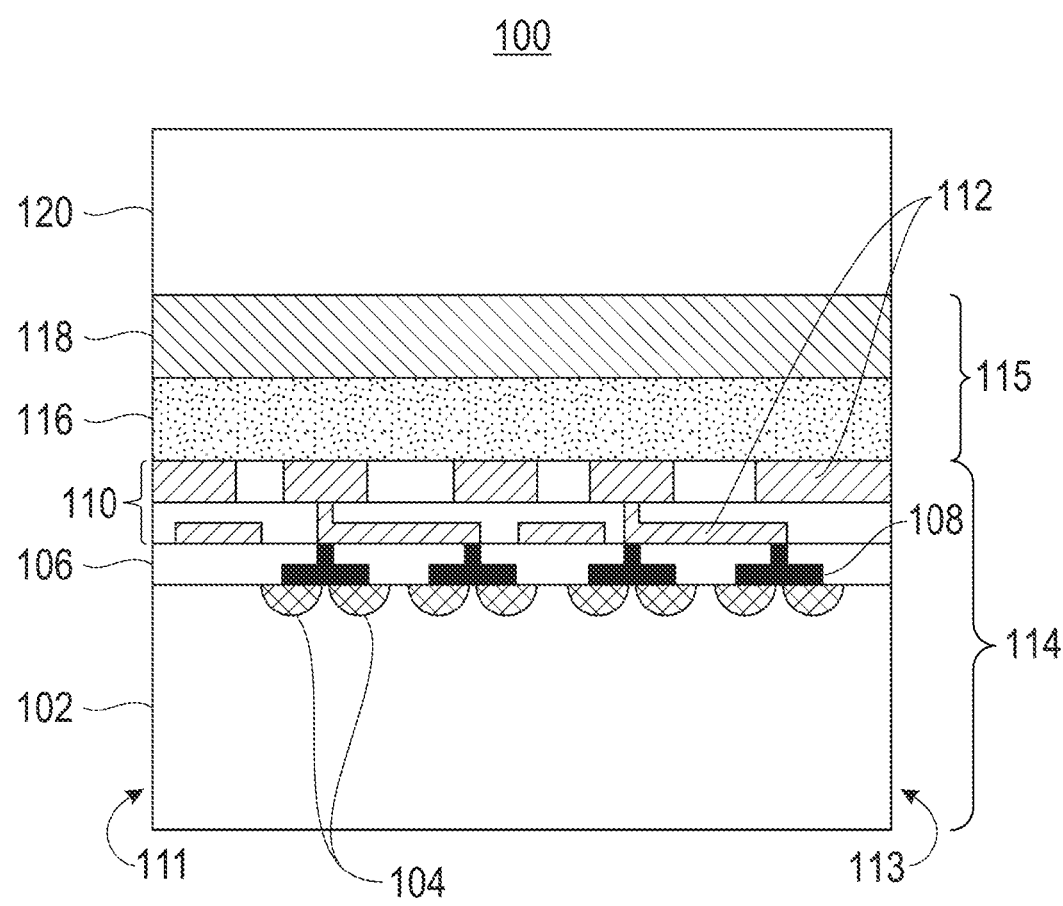
FIG. 4 is a cross-sectional view illustrating a process operation following that of FIG. 3, in accordance with embodiments of the disclosure.

FIG. 4 is a cross-sectional view illustrating a process operation following that of FIG. 3, in accordance with embodiments of the disclosure. FIG. 4 depicts the stack structure 100 with the handler wafer 120 temporarily, or removably, bonded to the device wafer 114. The process includes performing a wafer bonding process by bonding the handler wafer 120 to the device wafer 114 using the adhesive layer 116 that that is formed adjacent to the release layer 118. In one embodiment of the invention, the handler wafer 120 is a Si handler wafer (or substrate) which is bonded to a Si device wafer, as the use of a mechanical Si handler wafer enables compatibility with many CMOS silicon wafer processing technologies. In other embodiments, the handler wafer 120 can be formed of glass or other suitable materials that are transparent or semi-transparent (e.g., at least 50 percent transparent) to certain wavelengths in the IR spectrum that are generated by the IR laser ablation operation by the selected IR laser. Moreover, the release layer 118, according to embodiments of the disclosure, includes thin metallic layers and/or adhesive layers formed with metallic particles, which serve as releasable layers that can be substantially or completely ablated (vaporized) using low-power mid-wavelength IR laser radiation to debond the device wafer 114 and the handler wafer 120.

In other alternative embodiments, the stack structure 100 can be fabricated with the release layer 118 being formed on a surface of the handler wafer 120. For example, the release layer 118 can be formed by growing or otherwise placing a layer of carbon material (e.g., carbon nanotubes, graphene layer, etc.) on a surface of the handler wafer 120 using known techniques. A standard bonding process can be implemented to bond the handler wafer 120 (with the release layer 118 attached) to the device wafer 114 by the adhesive layer 116.

Once a wafer bonding process is complete, various wafer processing operations can be performed with the handler wafer 120 attached to the device wafer 114. Suitable wafer processing operations, such as grinding/polishing the backside (inactive) surface of the device wafer 114 to thin the device wafer 114, can be performed. Other wafer processing operations include, without limitation, forming through-silicon vias through the backside of the device wafer 114 to the ICs formed on the active side of the device wafer 114. Additional process operations can be employed to deposit thin films (such as, but not limited to, $SiO_2$ and/or $Si_3N_4$) that by means of compressive or tensile force on the Si substrate and/or handler wafer 120, help to minimize Si active wafer and/or bonded pair non-planarity (or warp).

In one embodiment, the release layer 118 can be configured (in material composition and thickness) to absorb substantially all the mid-wavelength IR laser energy and serve as a primary releasable layer of the bonding structure 115, which is ablated by the IR laser energy. The release layer 118 can improve the laser ablation efficiency and thus, reduce the ablation threshold of the bonding structure 115 (as compared to a bonding structure that uses an adhesive layer alone). In one embodiment, the release layer 118 can be irradiated with IR laser energy sufficient to fully vaporize (ablate) a portion of the release layer 118 that is exposed to the IR laser energy, or at least fully vaporize the material of the release layer 118 at the interface between the handler wafer 120 and the release layer 118 so as to release the handler wafer 120.

Figure 5:
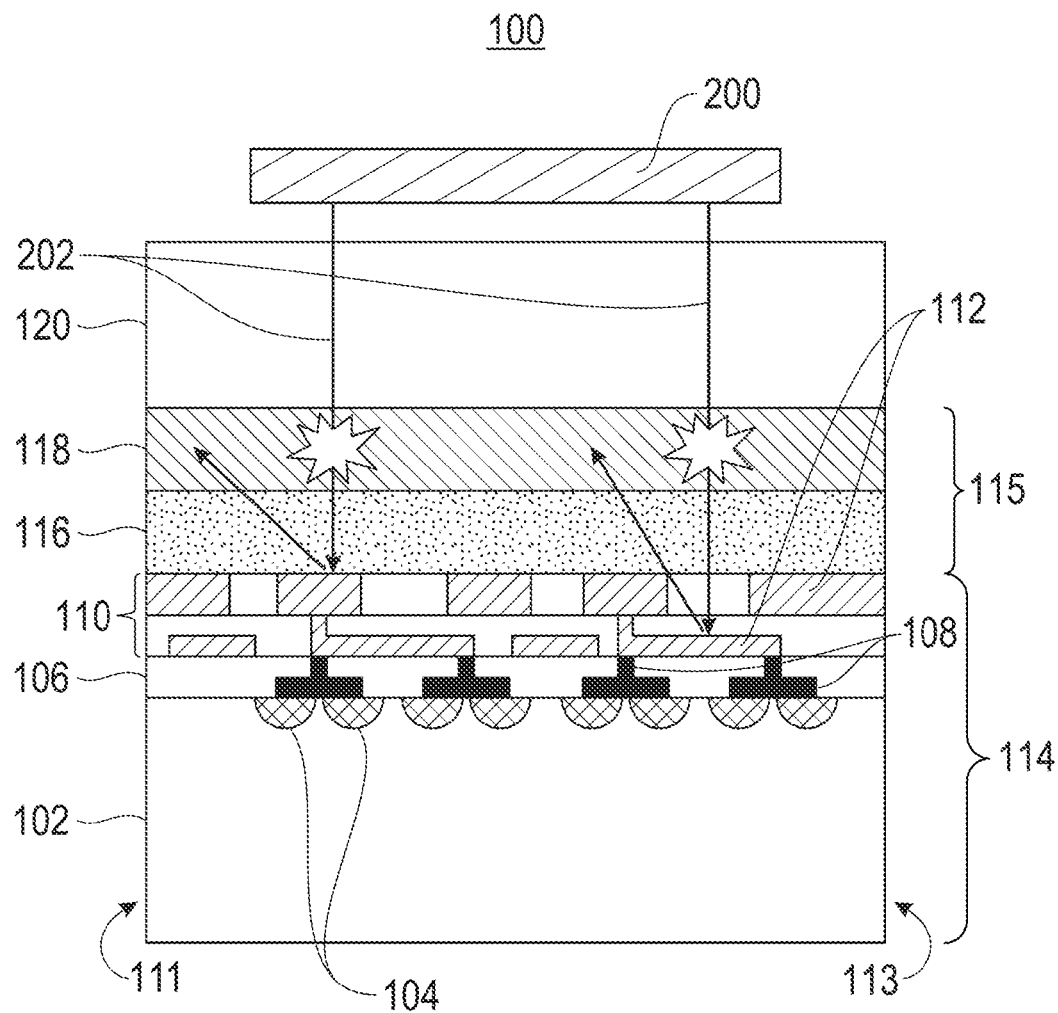
FIG. 5 is a cross-sectional view illustrating a process operation following that of FIG. 4, in accordance with embodiments of the disclosure.

FIG. 5 is a cross-sectional view illustrating a process operation following that of FIG. 4, in accordance with embodiments of the disclosure. As shown, an IR source 200 emits an IR laser beam (or energy) 202 at the handler wafer 120 to irradiate a portion of the release layer 118. This operation can include performing a laser ablation wafer debonding process to release the device wafer 114 from the handler wafer 120. As shown, the fill overlap pattern, made of fill portions 112 in consecutive layers of the BEOL 110, is configured to disable entry of the IR laser energy 202 into lower layers (e.g., FEOL 106, and device layer 102) of the device wafer 114. An advantage of such an effective "block" is that the IR laser energy 202 is blocked from entering into the lower layers of the stack structure 100 including the devices (e.g., devices 104, components 108, etc.), which avoids potential damage of the devices by the IR laser energy 202. The IR laser energy 202 can be used to debond the handler wafer 120 from the device wafer 114 while being blocked from potentially damaging the device wafer 114 components.

In one embodiment, this process involves irradiating the bonding structure 115 through the handler wafer 120 using mid-wavelength IR laser energy 202 to ablate the release layer 118 of the bonding structure 115 and release the device wafer 114. The IR source 200 can irradiate the stack structure 100 with mid-wavelength IR laser energy, for example. The bonding structure 115 can be irradiated with an amount of the IR laser energy 202 sufficient to fully vaporize (ablate) at least a portion of the release layer 118 that is exposed to the IR laser energy 202, as well as vaporize, denature, carbonize, or otherwise ablate and at least a portion of the adhesive layer 116 at an interface between the adhesive layer 116 and the portion of the release layer 118 that is irradiated and ablated. In other words, in the bonding structure 115 shown, the portion of the release layer 118 that is irradiated by the IR source 200 is heated and vaporized, and this heating and ablation of the release layer 118 results in heating of the surrounding material of the adhesive layer 116 (at the interface between the irradiated portion of the release layer 118 and the adhesive layer 116), which causes ablation of the adhesive layer 116. In addition, depending on the IR absorption properties of the material used to form the adhesive layer 116, ablation of the adhesive layer 116 can be further achieved by any additional heating that is due to absorption of the IR laser energy 202 by the adhesive layer 116. The ablation threshold of IR laser energy (level of exposure and time of exposure) for vaporizing the release layer 118 will vary depending on the thickness and type of material used to form the release layer 118. The release layer 118 can be configured to substantially absorb (and not reflect or transmit) the IR laser energy 202, so that ablation of the release layer 118 occurs. However, the IR laser energy 202 is not absorbed by the fill portions 112, but instead is blocked by the fill portions 112.

Once the IR laser ablation process (as in FIG. 5) is complete and the device wafer 114 is released from the handler wafer 120, a post debonding cleaning process can be performed to remove any remaining adhesive material or other residue (resulting from the ablation of the bonding structure 115) from the device wafer 114. For example, a cleaning process can be implemented using a chemical cleaning process or a wet cleaning process to remove any polymer based adhesive material. Other suitable cleaning methods to remove residue of the ablated bonding structure can be used, which are known to those of ordinary skill in the art.

One embodiment of the disclosure is a method for handling a device wafer 114. The method includes bonding a handler wafer 120 to a device wafer 114 using a bonding structure 115 that includes an adhesive layer 116 and a release layer 118, wherein the device wafer 114 includes a plurality of layers (e.g., 102, 106, 110) and at least two consecutive layers of BEOL 110 of the plurality of layers include a plurality of fill portions 112 that provide coverage across the device wafer 114 from a first side 111 to a second side 113 to form a fill overlap layer that is configured to substantially or completely disable entry of IR laser energy 202 into a plurality of layers of the device wafer 114 below the at least two consecutive layers of BEOL 110 that include the plurality of fill portions 112. The method also includes processing the device wafer 114 while bonded to the handler wafer 120. The method further includes debonding the device wafer 114 and the handler wafer 120 by irradiating the release layer 118 with IR laser energy 202 through the handler wafer 120 to substantially or completely vaporize the release layer 118 such that the device wafer 114 is released from the handler wafer 120 as a direct result of substantial or complete vaporization of the release layer 118.

Another embodiment of the disclosure is a method of making a semiconductor stack structure 100. The method includes forming a device wafer 114 by forming a device layer 102 including a plurality of devices 104, and forming at least two consecutive layers of BEOL 110 on a surface of the device wafer 114 that include a plurality of fill portions 112 that provide coverage across the device wafer 114 from a first side 111 to a second side 113 to form a fill overlap layer. The method also includes forming a handler wafer 120. The method also includes removably bonding the handler wafer 120 to the device wafer 114 using a bonding structure 115 including an adhesive layer 116 and a release layer 118, wherein the adhesive layer 116 is applied to one of the at least two consecutive layers of BEOL 110 that include a plurality of fill portions 112, and exposing IR laser energy 202 to the semiconductor stack structure 100 through the handler wafer 120 to cause debonding and release of the device wafer 114 from the handler wafer 120 as a direct result of the substantial or complete vaporization of at least a portion of the bonding structure 115. The fill overlap layer is configured to substantially or completely disable entry of the IR laser energy 202 into the device wafer 114 below the two consecutive layers of BEOL 110 that include a plurality of fill portions 112.

For purposes of description herein, the terms "upper," "lower," "top," "bottom," "left," "right," "rear," "front," "vertical," "horizontal," "frontside," "backside," and derivatives thereof shall relate to the devices as oriented in the figures. However, it is to be understood that the devices can assume various alternative orientations and step sequences, except where expressly specified to the contrary. It is also to be understood that the specific devices and processes illustrated in the attached drawings, and described in the following disclosure, are simply exemplary embodiments of the inventive concepts defined in the appended claims. Hence, other physical characteristics relating to the embodiments disclosed herein are not to be considered as limiting, unless the claims expressly state otherwise.

For purposes of this description, certain aspects, advantages, and novel features of the embodiments of this disclosure are described herein. The disclosed processes, and systems should not be construed as being limiting in any way. Instead, the present disclosure is directed toward all novel and nonobvious features and aspects of the various disclosed embodiments, alone or in various combinations and sub-combinations with one another. The processes, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially can in some cases be rearranged and/or performed concurrently. Moreover, for the sake of simplicity, the attached figures may not show the various ways in which the disclosed processes can be used in conjunction with other processes. Additionally, the description sometimes uses terms like "provide" or "achieve" to describe the disclosed processes. These terms are high-level abstractions of the actual operations that are performed. The actual operations that correspond to these terms can vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A stack structure comprising:
   a device wafer;
   a handler wafer; and
   a bonding structure disposed between the device wafer and the handler wafer, wherein one or both of the device wafer and the handler wafer have a release layer that is configured to be substantially or completely vaporized by infrared ablation when exposed to an infrared laser energy,
   wherein the device wafer includes at least two consecutive layers adjacent the bonding structure that together include a plurality of fill portions that substantially or completely disable entry of the infrared laser energy into a plurality of layers of the device wafer below the two consecutive layers adjacent the bonding structure.

2. The stack structure of claim 1, wherein the at least two consecutive layers are at least a portion of a back-end-of-line (BEOL) structure.

3. The stack structure of claim 1, wherein the plurality of layers of the device wafer below the two consecutive layers include a front-end-of-line (FEOL) structure.

4. The stack structure of claim 1, wherein the plurality of fill portions provide coverage across the device wafer from a first side to a second side to form a fill overlap layer.

5. The stack structure of claim 4, wherein the fill overlap layer is configured to substantially or completely mitigate damage to a plurality of devices included in the plurality of layers of the device wafer below the two consecutive layers adjacent the bonding structure.

6. The stack structure of claim 1, wherein the bonding structure removably binds the device wafer and the handler wafer together.

7. The stack structure of claim 1, wherein the infrared laser energy causes debonding and release of the device wafer from the handler wafer as a direct result of a substantial or a complete vaporization of at least a portion of the bonding structure.

8. A method for handling a device wafer, the method comprising:
bonding a handler wafer to a device wafer using a bonding structure that includes an adhesive layer and a release layer, wherein the device wafer includes a plurality of layers and at least two consecutive layers of the plurality of layers include a plurality of fill portions that substantially or completely disable entry of an infrared laser energy into a plurality of layers of the device wafer below the at least two consecutive layers that include the plurality of fill portions;
processing the device wafer while bonded to the handler wafer; and
debonding the device wafer and the handler wafer by irradiating the release layer with the infrared laser energy through the handler wafer.

9. The method of claim 8, wherein the at least two consecutive layers that include the plurality of fill portions are at least a portion of a back-end-of-line (BEOL) structure.

10. The method of claim 8, wherein the plurality of fill portions provide coverage across the device wafer from a first side to a second side to form a fill overlap layer.

11. The method of claim 10, wherein the fill overlap layer is configured to substantially or completely mitigate damage to a plurality of devices included in the plurality of layers of the device wafer below the two consecutive layers.

12. The method of claim 10, wherein the fill overlap layer includes a fill material of copper.

13. The method of claim 8, wherein the infrared laser energy substantially or completely vaporizes the release layer such that the device wafer is released from the handler wafer as a direct result of a substantial or a complete vaporization of the release layer.

14. The method of claim 8, wherein the plurality of layers of the device wafer below the two consecutive layers that include the plurality of fill portions include a front-end-of-line (FEOL) structure.

15. A method of making a semiconductor stack structure, the method comprising:
forming a device wafer by
forming a device layer including a plurality of devices, and
forming at least two consecutive layers on a surface of the device layer that include a plurality of fill portions;
forming a handler wafer;
removably bonding the handler wafer to the device wafer using a bonding structure including an adhesive layer and a release layer, wherein the adhesive layer is applied to one of the at least two consecutive layers that include the plurality of fill portions; and
exposing an infrared laser energy to the semiconductor stack structure through the handler wafer to cause debonding and release of the device wafer from the handler wafer as a direct result of a substantial or a complete vaporization of at least a portion of the bonding structure,
wherein the plurality of fill portions are configured to substantially or completely disable entry of the infrared laser energy into the device wafer below the two consecutive layers that include the plurality of fill portions.

16. The method of claim 15, wherein the at least two consecutive layers that include the plurality of fill portions are at least a portion of a back-end-of-line (BEOL) structure.

17. The method of claim 15, wherein the plurality of layers of the device wafer below the two consecutive layers, that include the plurality of fill portions, include a front-end-of-line (FEOL) structure.

18. The method of claim 15, wherein the plurality of fill portions provide coverage across the device wafer from a first side to a second side to form a fill overlap layer.

19. The method of claim 18, wherein the fill overlap layer includes a fill material of copper.

20. The method of claim 18, wherein the fill overlap layer is configured to substantially or completely mitigate damage to the plurality of devices included in the plurality of layers of the device wafer below the at least two consecutive layers that include the plurality of fill portions.

* * * * *